(12) United States Patent  
Kim (10) Patent No.: US 8,659,095 B2  
(45) Date of Patent: Feb. 25, 2014

(54) SEMICONDUCTOR MEMORY DEVICE AND METHOD OF MANUFACTURING THE SAME

(75) Inventor: Tae Gyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/563,189

(22) Filed: Jul. 31, 2012

(65) Prior Publication Data

US 2013/0043543 A1    Feb. 21, 2013

(30) Foreign Application Priority Data

Aug. 16, 2011    (KR) .......................... 10-2011-0081287

(51) Int. Cl.
*H01L 21/336* (2006.01)

(52) U.S. Cl.
USPC ........................................................ 257/392

(58) Field of Classification Search
USPC .......... 257/156, 314, 326, 330; 438/238, 256, 438/257

See application file for complete search history.

(56) References Cited

U.S. PATENT DOCUMENTS

| 5,512,771 | A  | * | 4/1996 | Hiroki et al. .................. 257/369 |
| 6,559,006 | B2 | * | 5/2003 | Ikeda et al. ..................... 438/256 |
| 2002/0127802 | A1 | * | 9/2002 | Goda et al. ..................... 438/257 |
| 2008/0124866 | A1 | * | 5/2008 | Eun et al. ....................... 438/264 |
| 2008/0283896 | A1 | * | 11/2008 | Noguchi et al. ............... 257/315 |
| 2009/0267136 | A1 | * | 10/2009 | Goda et al. ..................... 257/324 |
| 2009/0294821 | A1 | * | 12/2009 | Yun et al. ....................... 257/314 |
| 2010/0072560 | A1 | * | 3/2010 | Lee et al. ....................... 257/393 |

* cited by examiner

*Primary Examiner* — Ha Tran T Nguyen  
*Assistant Examiner* — Ismail Muse  
(74) *Attorney, Agent, or Firm* — IP & T Group LLP

(57) ABSTRACT

A semiconductor device includes a semiconductor substrate including a first driving transistor region having a first driving transistor disposed therein and a second driving transistor region having a second driving transistor disposed therein, wherein the second driving transistor is driven at a lower voltage than the first driving transistor, a first gate insulating layer formed at edges of the second driving transistor region, and a second gate insulating layer formed at a center of the second driving transistor region, wherein the first gate insulating layer is thicker than the second gate insulating layer.

14 Claims, 5 Drawing Sheets

SEMICONDUCTOR MEMORY DEVICE AND METHOD OF MANUFACTURING THE SAME

CROSS REFERENCE TO RELATED APPLICATION

Priority is claimed to Korean patent application number 10-2011-0081287 filed on Aug. 16, 2011, the entire disclosure of which is incorporated herein by reference in its entirety.

BACKGROUND

1. Field of Invention

Exemplary embodiments of the present invention relate to a semiconductor device and a method of manufacturing the same and, more particularly, to a semiconductor device having a plurality of transistors and a method of manufacturing the same.

2. Description of Related Art

A semiconductor device includes transistors that have different sizes and various electrical characteristics. For example, a flash memory device has low voltage transistors and high voltage transistors, different from each other, formed in a peripheral region thereof. The operation of low voltage transistors is controlled with a lower driving voltage than high voltage transistors. Thus, a method of stabilizing the operation of low voltage transistors has been developed. Particularly, a method of ensuring operating stability of low voltage transistors that have high leakage current characteristics due to their narrow width has been developed.

Figure 1:
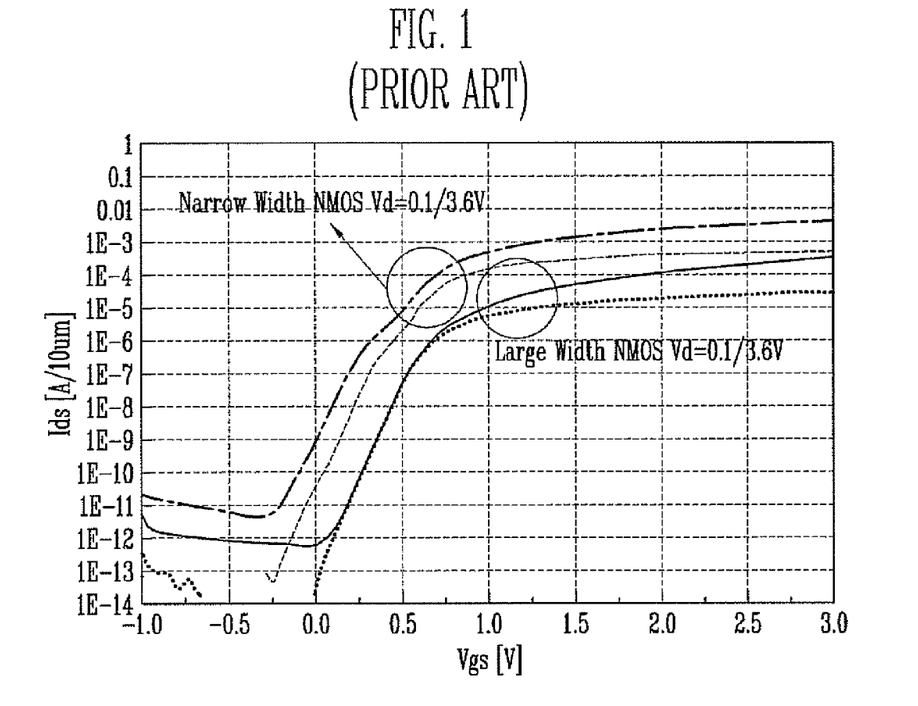
FIG. 1 is a graph illustrating drain current Ids in response to gate voltage Vgs of transistors having different widths.

FIG. 1 is a graph illustrating drain current Ids in response to gate voltage Vgs of NMOS transistors having different widths. As shown in FIG. 1, an NMOS transistor having a relatively narrow width has high leakage current characteristics such as a current hump.

In general, in order to improve leakage current characteristics, impurities for controlling a threshold voltage are implanted into an active region in which a narrow transistor will be formed. However, concentration of the impurities for controlling a threshold voltage at the edges of the active region may be reduced in subsequent processes. Hereinafter, the reduction in concentration of the impurities for controlling a threshold voltage at the edges of the active region will be described in detail by exemplifying an NMOS transistor having a narrow width.

When an NMOS transistor has a narrow width, an impurity for controlling a threshold voltage such as Boron is implanted into an active region of a semiconductor substrate in which the NMOS transistor will be formed, so as to improve leakage current characteristics. An isolation region of the semiconductor substrate is subsequently etched to form a trench. In order to eliminate damage during an etch process of forming the trench, the surface of the trench is oxidized to form a side-wall oxide layer. During the process of forming the side-wall oxide layer, the boron implanted into the edges of the active region is separated from the edges of the active region (that is, boron segregation occurs). As a result, boron concentration at the edges of the active region becomes lower than at the center of the active region. After the side-wall oxide layer is formed, the trench is filled with an insulating material to form an isolation layer that separates the active region. A gate insulating layer and a gate are sequentially formed on top of the active region, and impurities for forming source and drain regions are implanted into the active region on both sides of the gate. The gate insulating layer and a gate conductive layer may be etched by using an isolation mask pattern for forming a trench as an etch barrier after they are formed on the semiconductor substrate before the trench is formed.

As described above, during the process of forming the side-wall oxide layer, the concentration of the impurities (e.g., boron) for controlling a threshold voltage may become lower at the edges of the active region than at the center of the active region. Accordingly, a parasitic transistor that has a low threshold voltage is formed at the edges of the active region than in the central portion of the active region. This parasitic transistor causes leakage current. In order to avoid deterioration of leakage current characteristics caused by the parasitic transistor, a method of additionally implanting impurities for controlling a threshold voltage through a mask that opens, for example, only a low voltage transistor region (e.g., a low voltage NMOS transistor region) that has a narrow width and high leakage current characteristics has been developed. However, this method has limitations in controlling deterioration of leakage current characteristics.

BRIEF SUMMARY

Exemplary embodiments relate to a semiconductor device and a method of manufacturing the same that can improve leakage current characteristics of a low voltage transistor having a narrow width.

A semiconductor device according to an embodiment of the present invention includes a semiconductor substrate including a first driving transistor region having a first driving transistor disposed therein and a second driving transistor region having a second driving transistor disposed therein, wherein the second driving transistor is driven at a lower voltage than the first driving transistor, a first gate insulating layer formed at edges of the second driving transistor region, and a second gate insulating layer formed at a center of the second driving transistor region, wherein the first gate insulating layer is thicker than the second gate insulating layer.

A method of manufacturing a semiconductor device according to an embodiment of the present invention includes forming a mask pattern on a semiconductor substrate including a first driving transistor region and a second driving transistor region, the mask pattern opening the semiconductor substrate at portions corresponding to edges of the second driving transistor region, oxidizing the semiconductor substrate exposed by the mask pattern to form a first gate insulating layer, removing the mask pattern, and forming a second gate insulating layer thinner than the first gate insulating layer on the semiconductor substrate.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 2A:
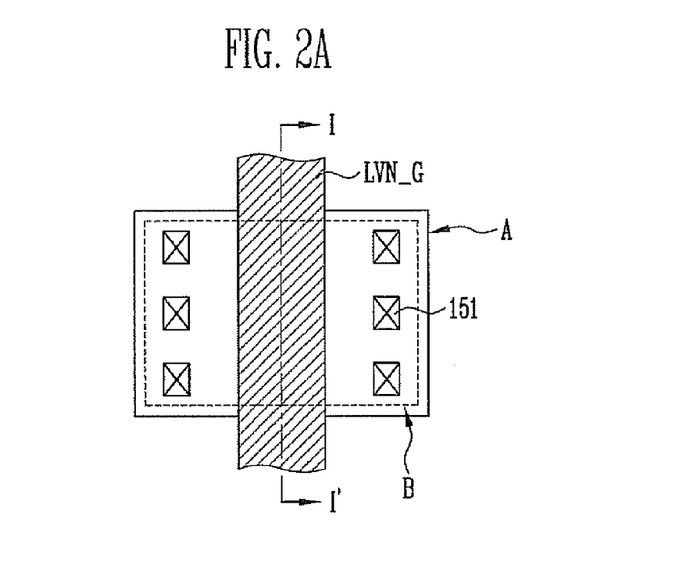
FIG. 2A is a plan view of a transistor of a semiconductor device according to a first embodiment of the present invention.
Figure 2B:
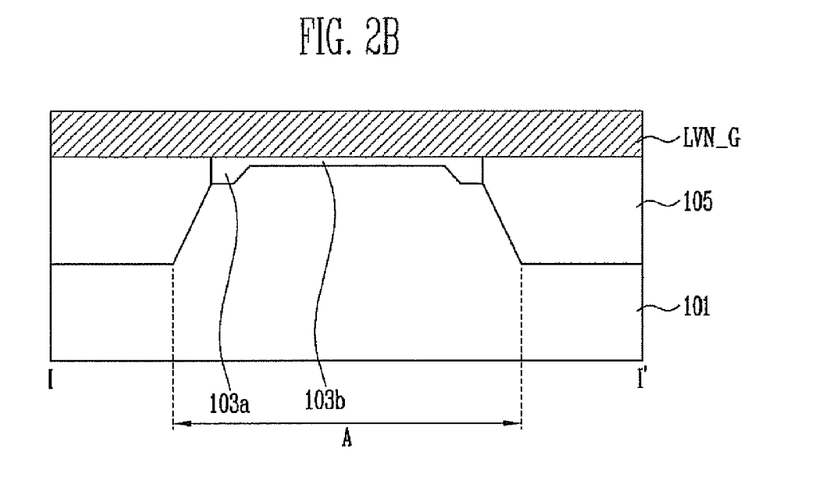
FIG. 2B is a cross-sectional view of the transistor of the semiconductor device taken along line "I-I'" of FIG. 2A.

FIG. 2A is a plan view of a transistor of a semiconductor device according to a first embodiment of the present invention. FIG. 2B is a cross-sectional view of the transistor of the semiconductor device taken along line "I-I'" of FIG. 2A. FIGS. 2A and 2B illustrate a low voltage NMOS transistor that is formed in a peripheral region of a flash memory device.

Referring to FIGS. 2A and 2B, the transistor of the semiconductor device according to the first embodiment of the present invention includes an active region A separated by an isolation layer 105, and the transistor is formed on top of a semiconductor substrate 101 into which well forming impurities and threshold voltage controlling impurities are implanted. In addition, the transistor according to the first embodiment of the present invention includes a first gate insulating layer 103a having a first thickness, a second gate insulating layer 103b having a second thickness smaller than the first thickness, a gate LVN_G formed on top of the first and second gate insulating layers 103a and 103b, and a source region and a drain region formed in the active region A on both sides of the gate LVN_G. A plurality of contact plugs 151 that are connected to upper wiring (not shown) are coupled to the source region and the drain region.

According to the first embodiment of the present invention, the first gate insulating layer 103a is formed at the upper edges of the active region A. The second gate insulating layer 103b is formed at the upper center of the active region A. In order to form the first and second gate insulating layers 103a and 103b having different thicknesses, a region B in which the second gate insulating layer 103b will be formed is blocked by a mask, and an oxidation process is performed to form the first gate insulating layer 103a. Subsequently, the mask is removed to form the second gate insulating layer 103b having a smaller thickness than the first gate insulating layer 103a.

According to the first embodiment of the present invention, the first gate insulating layer 103a formed at edges of the transistor is thicker than the second gate insulating layer 103b formed in the center portion of the transistor. Therefore, according to the first embodiment of the present invention, the threshold voltage of the transistor may be higher at the edges of the active region A than in the center portion of the active region A. Meanwhile, processes of etching an isolation region of the semiconductor substrate 101 to form a trench and oxidizing a sidewall of the trench to form a side-wall oxide layer may be performed to form the isolation layer 105. Here, concentration of the threshold voltage controlling impurities at the edges of the active region A may be smaller and a parasitic transistor may be formed at the edges of the active region A. However, a threshold voltage of the parasitic transistor may be increased by the first gate insulating layer 103a that has a relatively large thickness at the edges of the active region A. As a result, the transistor of the semiconductor device according to the first embodiment of the present invention can reduce deterioration of leakage current characteristics caused by a low threshold voltage of the parasitic transistor.

Figure 3A:
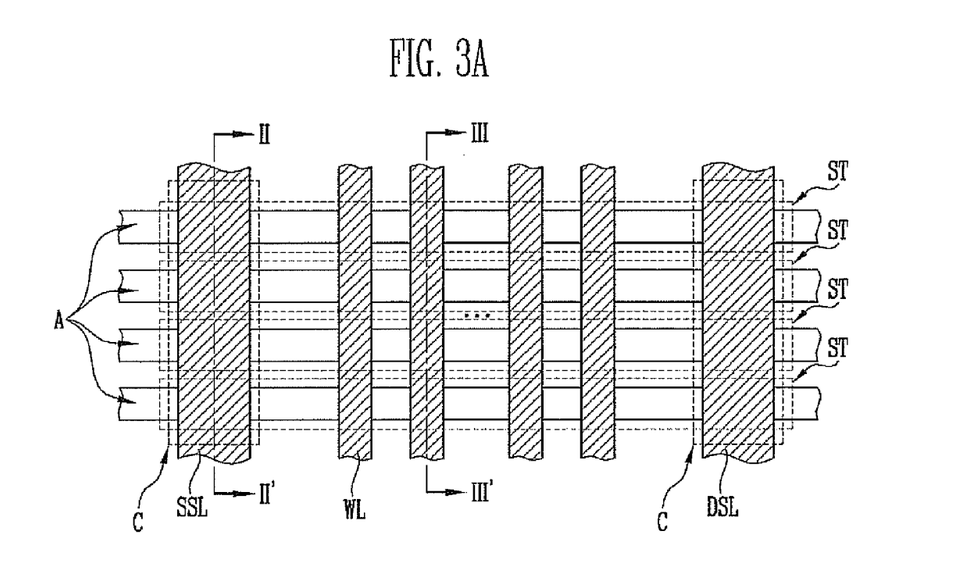
FIG. 3A is a plan view of transistors of a semiconductor device according to a second embodiment of the present invention.
Figure 3B:
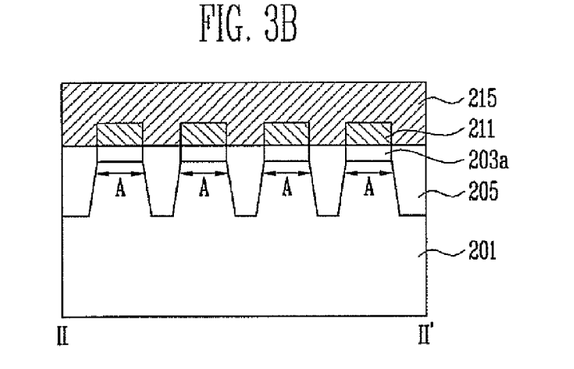
FIG. 3B is a cross-sectional view of the transistors of the semiconductor device taken along line "II-II'" of FIG. 3A.
Figure 3C:
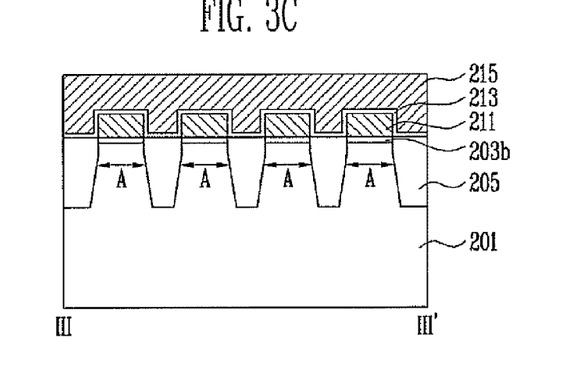
FIG. 3C is a cross-sectional view of the transistors of the semiconductor device taken along line "III-III'" of FIG. 3A.

FIG. 3A is a plan view of transistors of a semiconductor device according to a second embodiment of the present invention. FIG. 3B is a cross-sectional view of the transistors of the semiconductor device taken along line "II-II'" of FIG. 3A. FIG. 3C is a cross-sectional view of the transistors of the semiconductor device taken along line "III-III'" of FIG. 3A. FIGS. 3A to 3C together illustrate a portion of a cell array region of a flash memory device. Though FIG. 3B illustrates a cross-section taken in a direction of a source select line, a cross-section taken in a direction of a drain select line is the same as that of FIG. 3B.

As shown in FIG. 3A, memory strings ST are formed in a cell array region of a flash memory device. Each of the memory strings ST has a source select transistor, a plurality of memory cell transistors, and a drain select transistor that are arranged in a line on an active region A. The memory cell transistors are coupled in series between the source select transistor and the drain select transistor.

Gates of the memory string ST are coupled to gate lines (SSL, DSL, and WL) that cross the active regions A. Specifically, a gate of the source select transistor is coupled to a source select line SSL, while a gate of the drain select transistor is coupled to a drain select line DSL. In addition, gates of the memory cell transistors are coupled to word lines WL, respectively. As for the flash memory device, as shown in FIGS. 3B and 3C, each of the gates of the source select transistor, the drain select transistor, and the memory cell transistors has a first gate insulating layer 203a or a second gate insulating layer 203b, a first conductive layer 211 for a floating gate, a dielectric layer 213, and a second conductive layer 215 for a control gate stacked one upon another. According to an example, the first conductive layer 211 and the second conductive layer 215 of each of the source select transistor and the drain select transistor are electrically coupled to each other through contact holes formed in the dielectric layer 213. The first conductive layer 211 and the second conductive layer 215 of each of the memory cell transistors are insulated from each other with the dielectric layer 213 interposed therebetween. The second conductive layer 215 is patterned in the same pattern as the gate lines SSL, DSL, and WL. The first conductive layer 211 is formed at intersections between the active regions A and the gate lines SSL, DSL, and WL.

The select transistors forming the above-described memory strings ST have a smaller width than driving transistors that are arranged in a peripheral region to form driving circuits, and the select transistors are driven at low voltage. In order to improve leakage current characteristics generated by the select transistors of the memory strings ST, the semiconductor device according to the second embodiment of the present invention is provided.

Referring to FIGS. 3A to 3C, the select transistors and the memory cells according to the second embodiment of the present invention include the active regions A separated by an isolation layer 205. In addition, the select transistors and the memory cells are formed on top of a semiconductor substrate 201 into which well forming impurities and threshold voltage controlling impurities are implanted.

Each of the select transistors according to the second embodiment of the present invention includes the first gate insulating layer 203a, a select gate having the first and second conductive layers 211 and 215 that are stacked, and a junction formed in the active region A on both sides of the select gate. According to the second embodiment of the present invention, the first gate insulating layer 203a for a select transistor is thicker than the second gate insulating layer 203b for a memory cell. In addition, the first and second conductive layers 211 and 215 for a select transistor are electrically coupled to each other through the contact holes formed in the dielectric layer 213.

In addition, according to the second embodiment of the present invention, each of the memory cells includes the second gate insulating layer 203b for a memory cell, which is thinner than the first gate insulating layer 203a for a select transistor, a cell gate having the first and second conductive layers 211 and 215 that are stacked and insulated from each other by the dielectric layer 213, and a junction formed at the active region A on both sides of the cell gate. The first conductive layer 211 of the memory cell is a floating gate, while the second conductive layer 215 thereof is a control gate that becomes the word line WL.

According to the second embodiment of the present invention, the following process is performed such that the second gate insulating layer 203b for a memory cell and the first gate insulating layer 203a for a select transistor formed at both ends of the memory string ST may have different thicknesses from each other. First, a mask pattern that blocks a memory cell region and opens a select transistor region is formed. Subsequently, an oxidation process is performed on the semiconductor substrate 201 exposed by the mask pattern to form the first gate insulating layer 203a for a select transistor. The mask pattern is removed to form the second gate insulating layer 203b for a memory cell that has a relatively small thickness.

The mask pattern that blocks the memory cell region and opens the select transistor region may be a photoresist pattern or a layer patterned using a photoresist pattern as an etch mask. Since a photoresist pattern is formed by exposure and development processes, the width of the photoresist pattern is limited by the resolution of exposure equipment. Since the active region A of the select transistor region is narrower than the active region A of the peripheral region, there are difficulties in forming a photoresist pattern used to form a mask that exposes the active regions A of the select transistor region. In order to overcome these difficulties, in the present invention, during the process of forming a mask pattern that opens the select transistor region, the mask pattern is formed to have a line-type opening C that follows the select line DSL or SSL. In this manner, isolation regions of the select transistor region as well as the active regions A of the select transistor region are exposed. During the mask pattern forming process, the opening C of the mask pattern may open a portion of a word line forming region adjacent to the select transistor region. However, in general, since the word line forming region adjacent to the select transistor region is used as a dummy area, even when the gate insulating layer corresponding to the word line forming region adjacent to the select transistor region has a large thickness, the gate insulating layer has little influence on electrical characteristics of a memory cell.

According to the second embodiment of the present invention, the first gate insulating layer 203a formed at both ends of the memory string ST has a greater thickness than the second gate insulating layer 203b for a memory cell. Therefore, according to the second embodiment of the present invention, the select transistors have a high threshold voltage to thus avoid deterioration of leakage current characteristics caused by the select transistors.

FIGS. 4A to 4D are cross-sectional views illustrating a method of manufacturing a semiconductor device according to an embodiment of the present invention. FIGS. 4A to 4D together illustrate a method of manufacturing the flash memory device including the driving transistor described in connection with FIGS. 2A and 2B and the select transistors and the memory cells described in connection with FIGS. 3A to 3C.

Figure 4A:
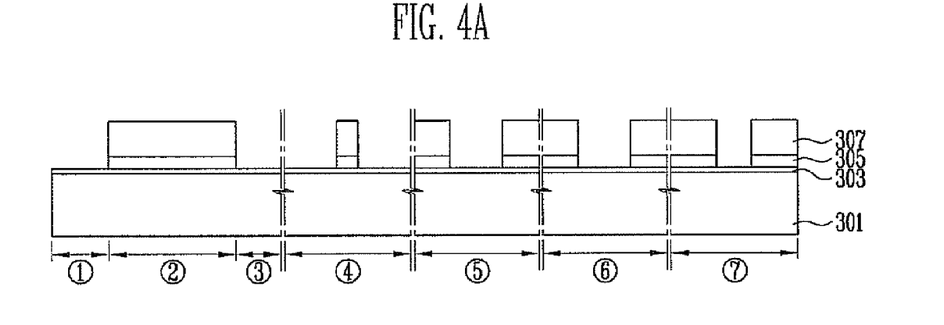
FIGS. 4A to 4D are cross-sectional views illustrating a method of manufacturing a semiconductor device according to an embodiment of the present invention.

Referring to FIG. 4A, a mask pattern (305 and 307) is formed on top of a semiconductor substrate 301 into which well forming impurities and threshold voltage controlling impurities are implanted. The mask pattern (305 and 307) may be formed of a single photoresist layer. Alternatively, the mask pattern (305 and 307) may be formed in such a manner that forms a photoresist pattern 307 on a hard mask layer 305 and patterns the hard mask layer 305 by using the photoresist pattern 307 as an etch mask. Here, the hard mask layer 305 may be a nitride layer. The mask pattern (305 and 307) opens a region in which a thick gate insulating layer will be formed.

Before the mask pattern (305 and 307) is formed, a screen oxide layer 303 may be further formed on the semiconductor substrate 301 so as to prevent damage to the semiconductor substrate 301.

Select transistor regions ($\hat{1}$ and $\hat{3}$), a memory cell region $\hat{2}$, first driving transistor regions ($\hat{5}$, $\hat{6}$, and $\hat{7}$), and a second driving transistor region $\hat{4}$ are defined in the semiconductor substrate 301. The select transistor regions ($\hat{1}$ and $\hat{3}$), the memory cell region $\hat{2}$, the first driving transistor regions ($\hat{5}$, $\hat{6}$, and $\hat{7}$), and the second driving transistor region $\hat{4}$ each includes an active region and an isolation region. The select transistor regions ($\hat{1}$ and $\hat{3}$) include a source select transistor region $\hat{1}$ and a drain select transistor region $\hat{3}$. The memory cell region $\hat{2}$ is disposed between the source select transistor region $\hat{1}$ and the drain select transistor region a The first driving transistor regions ($\hat{5}$, $\hat{6}$, and $\hat{7}$) and the second driving transistor region $\hat{4}$ form a peripheral region in which driving transistors that form driving circuits will be formed. Second driving transistors that are driven at a lower voltage than first driving transistors to be formed in the first driving transistor regions ($\hat{5}$, $\hat{6}$, and $\hat{7}$) are formed in the second driving transistor region $\hat{4}$. Hereinafter, the first driving transistor regions ($\hat{5}$, $\hat{6}$, and $\hat{7}$) and the second driving transistor region $\hat{4}$ will be described in more detail.

The second driving transistor region $\hat{4}$ may be a low voltage NMOS transistor region, whereas the first driving transistor regions may include a high voltage PMOS transistor region $\hat{5}$, a depletion high voltage NMOS transistor region $\hat{6}$, and a high voltage NMOS transistor region $\hat{7}$. A high voltage NMOS transistor is driven through an N type channel, in the same manner as is done for a low voltage NMOS transistor. The high voltage NMOS transistor may also have a narrow width. In this case, the mask pattern (305 and 307) may open the edges of the select transistor regions ($\hat{1}$ and $\hat{3}$), the high voltage PMOS transistor region $\hat{5}$, the depletion high voltage NMOS transistor region $\hat{6}$, the high voltage NMOS transistor region $\hat{7}$, and the second driving transistor region $\hat{4}$.

Figure 4B:
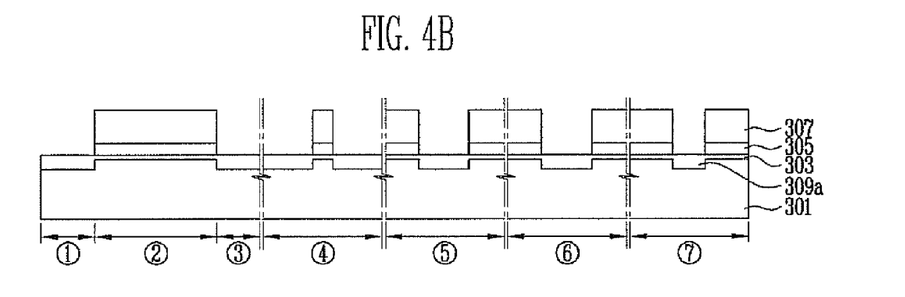

Referring to FIG. 4B, a cleaning process is performed after the mask pattern (305 and 307) is formed. An exposed region of the screen oxide layer 303 may be removed by the cleaning process. Subsequently, the semiconductor substrate 301 opened by the mask pattern (305 and 307) is oxidized to form a first gate insulating layer 309a having a first thickness.

Figure 4C:
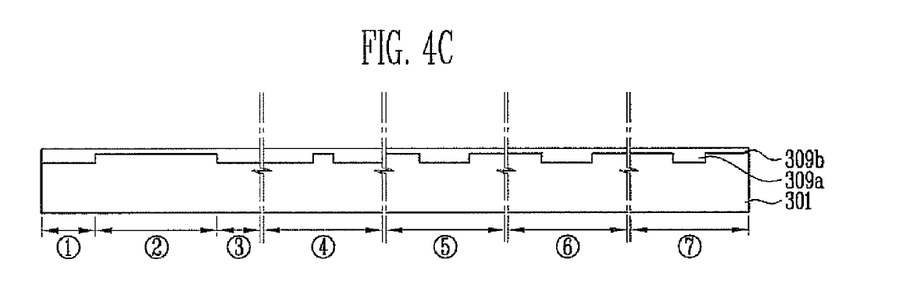

Referring to FIG. 4C, after the first gate insulating layer 309a is formed, the mask pattern (305 and 307) is removed and a cleaning process is performed. The screen oxide layer 303 may be removed by the cleaning process. Subsequently, the exposed semiconductor substrate 301 is oxidized to form a second gate insulating layer 309b having a second thickness smaller than the first thickness. In this manner, the first and second gate insulating layers 309a and 309b having different thicknesses is formed.

Figure 4D:
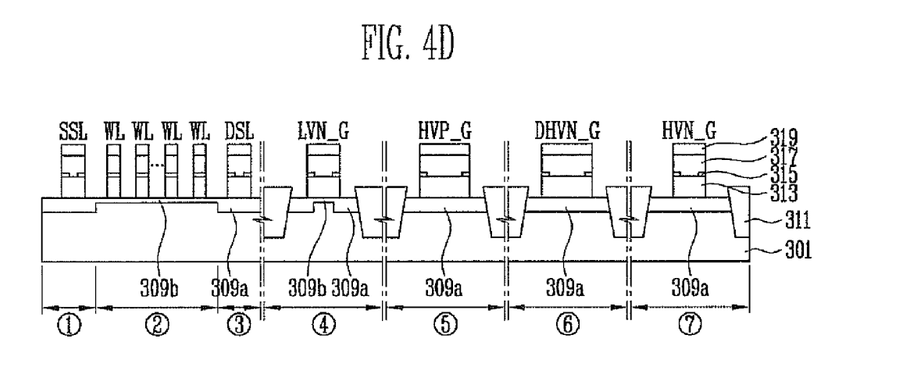

Referring to FIG. 4D, a first conductive layer 313 for a floating gate is formed on top of the entire structure including the first and second gate insulating layers 309a and 309b. Subsequently, an isolation mask pattern (not shown) that opens an isolation region is formed on the first conductive layer 313. The first conductive layer 313 and the first and second gate insulating layers 309a and 309b formed on the isolation region are removed to expose the isolation region of the semiconductor substrate 301. Next, the isolation region of the semiconductor substrate 301 is etched to form a trench, and an oxidation process is performed to remove damage to the surface of the trench and form a side-wall insulating layer on the sidewall of the trench. Subsequently, the trench is filled with an insulating material, and the isolation mask pattern is removed. By controlling the height of the insulating material inside the trench, an isolation layer 311 that separates the active regions of the semiconductor substrate 301 is formed.

The first gate insulating layer 309a remains in upper portions of the semiconductor substrate 301 that correspond to the select transistor regions ($\hat{1}$ and $\hat{3}$) and the first driving transistor regions ($\hat{5}$, $\hat{6}$, and $\hat{7}$) that are separated by the isolation layer 311. In addition, the first gate insulating layer 309a remains in upper portions of the semiconductor substrate 301 that correspond to the edges of the second driving transistor region $\hat{4}$. In addition, the second gate insulating layer 309b remains in upper portions of the semiconductor substrate 301 that correspond to the memory cell region $\hat{2}$ and center portions of the second driving transistor region $\hat{4}$.

A dielectric layer 315 is formed on top of the entire structure having the isolation layer 311 and the first conductive layer 313 formed thereon. Subsequently, contact holes are formed in the dielectric layer 315 so as to expose the first conductive layer 313 of the select transistor regions ($\hat{1}$ and $\hat{3}$), the first driving transistor regions ($\hat{5}$, $\hat{6}$, and $\hat{7}$), and the second driving transistor region $\hat{4}$. Next, a second conductive layer 317 for a control gate and a gate hard mask pattern 319 are sequentially stacked on the dielectric layer 315 in which the contact holes are formed. Subsequently, the second conductive layer 317, the dielectric layer 315, and the first conductive layer 313 are etched by an etch process using the gate hard mask pattern 319 as an etch barrier. Through this gate patterning process, gates HVP_G, DHVN_G, and HVN_G of the first driving transistors are formed on the first gate insulating layer 309a of the first driving transistor regions ($\hat{5}$, $\hat{6}$, and $\hat{7}$). In addition, a gate LVN_G of the second driving transistor is formed on the first and second gate insulating layers (309a and 309b) of the second driving transistor region $\hat{4}$. In addition, word lines WL, which are memory cell gates, are formed on the second gate insulating layer 309b of the memory cell region $\hat{2}$, while the source select line SSL and the drain select line DSL, which are select gates, are formed on the first gate insulating layer 309a of the select transistor regions ($\hat{1}$ and $\hat{3}$).

As described above, in the present invention, a gate insulating layer of first driving transistors that are driven at a relatively high voltage and a gate insulating layer to be formed at the edges of an active region of a second driving transistor that is driven at a relatively low voltage are formed at the same time. Accordingly, in the present invention, there is no need to add a separate mask process that causes a portion of the gate insulating layer of the second driving transistor to become thicker. In addition, in the present invention, a gate insulating layer of first driving transistors that are driven at a relatively high voltage and a gate insulating layer of select transistors that are driven at a relatively low voltage are formed at the same time. Accordingly, there is no need to add a separate mask process that causes the gate insulating layer of the select transistors to become thicker.

Figure 5A:
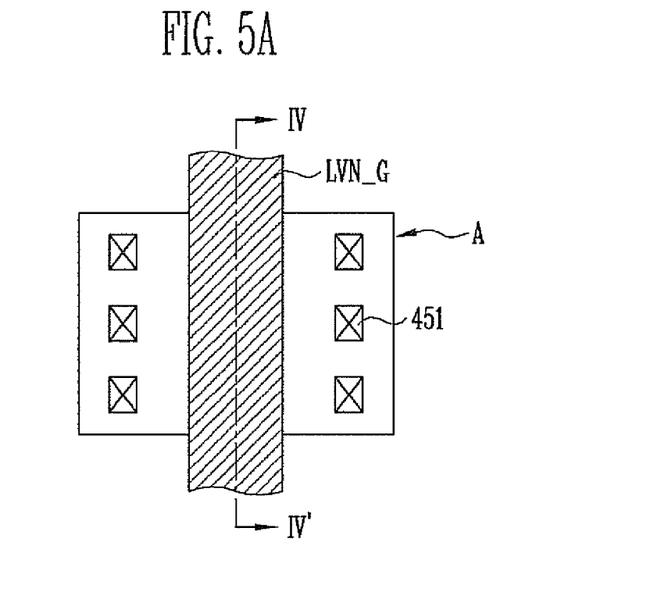
FIG. 5A is a plan view of a transistor of a semiconductor device according to a third embodiment of the present invention.
Figure 5B:
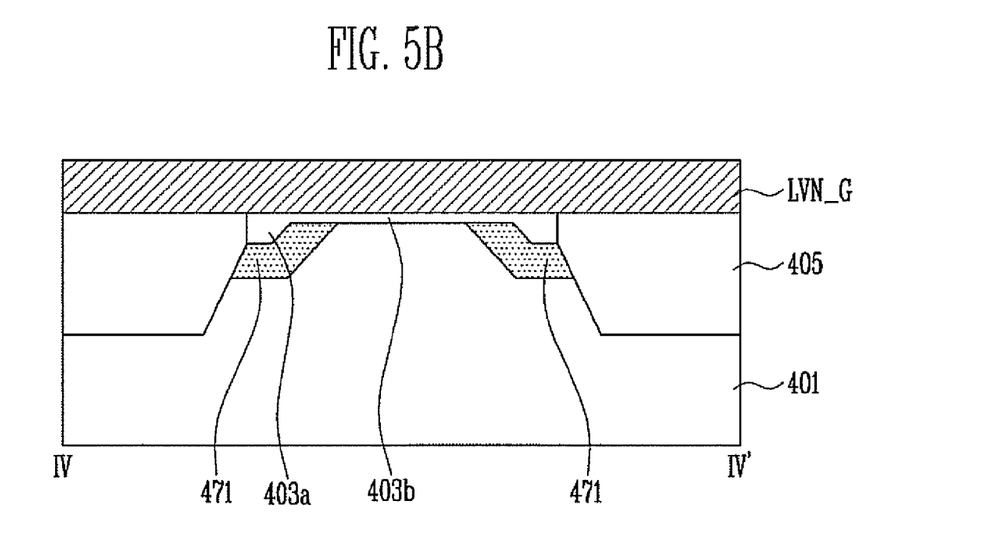
FIG. 5B is a cross-sectional view of the transistor of the semiconductor device taken along line "IV-IV'" of FIG. 5A.

FIG. 5A is a plan view of a transistor of a semiconductor device according to a third embodiment of the present invention. FIG. 5B is a cross-sectional view of the transistor of the semiconductor device taken along line "IV-IV'" of FIG. 5A. FIGS. 5A and 5B particularly illustrate a low voltage NMOS transistor that is formed in a peripheral region of a flash memory device.

Referring to FIGS. 5A and 5B, according to the third embodiment of the present invention, the transistor of the semiconductor device includes an active region A that is separated by an isolation layer 405, and the transistor is formed on top of a semiconductor substrate 401 into which well forming impurities and threshold voltage controlling impurities are implanted.

The type and concentration of the threshold voltage controlling impurities and impurity implantation energy thereof vary according to transistor types. For example, when the semiconductor substrate 401 includes a high voltage NMOS transistor region, a low voltage NMOS transistor region, a select transistor region, and a memory cell region, the same type of threshold voltage controlling impurities that are present at the same concentration and have the same energy are implanted into the select transistor region and the memory cell region except for the peripheral region through a first impurity mask that blocks the peripheral region and opens the select transistor region and the memory cell region.

In addition, threshold voltage controlling impurities (e.g., boron) are implanted into the high voltage NMOS transistor region through a second impurity mask that blocks the select transistor region and the memory cell region and opens the high voltage NMOS transistor region. At this point, in order to increase a threshold voltage of a parasitic transistor that is formed in the low voltage NMOS transistor region, the edges of the low voltage NMOS transistor region may be exposed through the second impurity mask. The width of the edges of the low voltage NMOS transistor region exposed through the second impurity mask is larger than that of a region in which a first gate insulating layer 403a will be formed. In addition, the threshold voltage controlling impurities implanted by using the second impurity mask are implanted into a position deeper than the region in which the first gate insulating layer 403a will be formed. As a result, after the first gate insulating layer 403a is formed in the subsequent process, a threshold voltage controlling impurity implanted-region 471 may remain in the semiconductor substrate 401 adjacent to the first gate insulating layer 403a without oxidizing.

The transistor according to the third embodiment of the present invention includes a first gate insulating layer 403a having a first thickness, a second gate insulating layer 403b having a second thickness smaller than the first thickness, a gate LVN_G formed on the first and second gate insulating layers 403a and 403b, and a source region and a drain region formed in the active region A on both sides of the gate LVN_G. A plurality of contact plugs 451 that are connected to upper wiring (not shown) are coupled to the source region and drain region.

According to the third embodiment of the present invention, the first gate insulating layer 403a is formed at upper edges of the active region A that correspond to the edges of a transistor region. The second gate insulating layer 403b is formed in the upper center portion of the active region A corresponding to the center portion of the transistor region. In order to form the first and second gate insulating layers 403a and 403b having different thicknesses from each other, after a region in which the second gate insulating layer 403b will be formed is blocked by a mask pattern, an oxidation process is performed to form the first gate insulating layer 403a. The thickness of the first gate insulating layer 403a is smaller than a depth of the threshold voltage controlling impurity implanted region 471, and the width of the first gate insulating layer 403a is smaller than the width of the threshold voltage controlling impurity implanted region 471. Therefore, a bottom surface of the first gate insulating layer 403a may be surrounded by the threshold voltage controlling impurity implanted-region 471 in the semiconductor substrate 401. After the first gate insulating layer 403a is formed, the mask pattern is removed to form the second gate insulating layer 403b that is thinner than the first gate insulating layer 403a.

The gate insulating layer of the transistor, that includes the first and second gate insulating layers 403a and 403b according to the third embodiment of the present invention, is thicker at the edges of the active region A than in the center portion of the active region A. Accordingly, a threshold voltage of the transistor according to the third embodiment of the present invention may be higher at the edges of the active region A than in the center portion of the active region A. Processes of etching an isolation region of the semiconductor substrate 401 to form a trench and oxidizing a sidewall of the trench to form a side-wall oxide layer may be performed to form the isolation layer 405. At this point, concentration of the threshold voltage controlling impurities at the edges of the active region A may be reduced so that a parasitic transistor may be generated at the edges of the active region A. A threshold voltage of the parasitic transistor may be increased by the first gate insulating layer 403a that has a relatively large thickness at the edges of the active region A. Accordingly, according to the third embodiment of the present invention, deterioration of leakage current characteristics caused by a low threshold voltage of a parasitic transistor can be avoided. In the third embodiment of the present invention, the threshold voltage of the parasitic transistor can further be increased by the threshold voltage controlling impurity implanted-region 471 that remains in the active region A around the gate insulating layer 403a.

According to exemplary embodiments, edges of a gate insulating layer of a low voltage driving transistor (e.g., a low voltage NMOS transistor of a flash memory device) that has a relatively small width and is driven at a relatively low voltage are thicker than in a center portion thereof. Accordingly, a threshold voltage of a parasitic transistor that is formed at the edges of the low voltage driving transistor is increased to improve leakage current characteristics.

In addition, according to exemplary embodiments of the present invention, a thick gate insulating layer of a low voltage driving transistor and a gate insulating layer of a high voltage driving transistor (e.g., a high voltage NMOS transistor of a flash memory device) are formed at the same time. Accordingly, there is no need to add a separate mask process that causes the edges of the gate insulating layer of the low voltage transistor to become thicker.

What is claimed is:

1. A semiconductor device, comprising:
    a semiconductor substrate including:
        a first driving transistor region having a first driving transistor disposed therein;
        a second driving transistor region having a second driving transistor disposed therein;
        a select transistor region; and
        a memory cell region,
        wherein a driving voltage of the second driving transistor is lower than that of the first driving transistor;
    a first gate insulating layer formed at each of the first driving transistor region, the select transistor region and edges of the second driving transistor region; and
    a second gate insulating layer formed at each of the memory cell region and a center of the second driving transistor region,
    wherein the first gate insulating layer is thicker than the second gate insulating layer.

2. A method of manufacturing a semiconductor device, the method comprising:
    forming a mask pattern on a semiconductor substrate including a first driving transistor region, a second driving transistor region, a select transistor region and a memory cell region, wherein the mask pattern opens the semiconductor substrate at portions corresponding to the first driving transistor region, the select transistor region and edges of the second driving transistor region, and blocks the semiconductor substrate at portions corresponding to the memory cell region and a center of the second driving transistor region;
    oxidizing the semiconductor substrate exposed by the mask pattern, thereby forming a first gate insulating layer at each of the first driving transistor region, the select transistor region and edges of the second driving transistor region;
    removing the mask pattern; and
    forming a second gate insulating layer at each of the memory cell region and a center of the second driving transistor region,
    wherein the first gate insulating layer is thicker than the second gate insulating layer.

3. The semiconductor device of claim 1, further comprising an impurity implanted-region provided in the semiconductor substrate adjacent to the first gate insulating layer of the ekes of the second driving transistor region.

4. The semiconductor device of claim 1, wherein the first driving transistor and the second driving transistor include NMOS transistors.

5. The semiconductor device of claim 4, further comprising a first impurity implanted-region for controlling a threshold voltage, wherein the first impurity implanted-region is provided in the semiconductor substrate at the first driving transistor region.

6. The semiconductor device of claim 4, further comprising a second impurity-implanted region including boron, provided in the semiconductor substrate adjacent to the first gate insulating layer of the edges of the second driving transistor region.

7. The method of claim 2, further comprising forming a gate on the second driving transistor region after the first and second gate insulating layers are formed.

8. The method of claim 7, wherein the gate is formed on the first and second gate insulating layers.

9. The method of claim 2, further comprising implanting impurities into the semiconductor substrate at the portions corresponding to the edges of the second driving transistor region to form an impurity region before the forming of the mask pattern.

10. The method of claim 9, wherein the impurity region is formed in the semiconductor substrate adjacent to the first gate insulating layer.

11. The method of claim 9, wherein the forming of the impurity region is performed at the same time as implanting of impurities into the semiconductor substrate at a portion corresponding to the first driving transistor region.

12. The method of claim 2, wherein driving transistors having the same channel configuration are formed in the first and second driving transistor regions.

13. The semiconductor device of claim 1, wherein a bottom of the first gate insulating layer is lower than a bottom of the second gate insulating layer.

14. The semiconductor device of claim 13, wherein the first gate insulating layer is an oxidized portion of the semiconductor substrate.

* * * * *